United States Patent
Kisielowski et al.

[11] Patent Number: 6,139,629
[45] Date of Patent: Oct. 31, 2000

[54] GROUP III-NITRIDE THIN FILMS GROWN USING MBE AND BISMUTH

[75] Inventors: Christian K. Kisielowski, Peidmont; Michael Rubin, Berkeley, both of Calif.

[73] Assignee: The Regents of the University of California, Oakland, Calif.

[21] Appl. No.: 09/055,064

[22] Filed: Apr. 3, 1998

Related U.S. Application Data

[60] Provisional application No. 60/043,042, Apr. 3, 1997.

[51] Int. Cl.$^7$ .................................................. C30B 23/06
[52] U.S. Cl. ............................ 117/105; 117/108; 117/952
[58] Field of Search ..................... 117/105, 108, 117/952

[56] References Cited

U.S. PATENT DOCUMENTS

| | | | |
|---|---|---|---|
| 5,657,335 | 8/1997 | Rubin et al. ............................... | 372/44 |
| 5,725,674 | 3/1998 | Moustakas et al. ...................... | 118/715 |
| 5,767,581 | 6/1998 | Nakamura et al. ...................... | 257/749 |
| 5,804,839 | 9/1998 | Hanaoka et al. ......................... | 257/123 |
| 5,843,227 | 12/1998 | Kimura et al. ........................... | 117/101 |
| 5,888,886 | 3/1999 | Sverdlov et al. ........................ | 438/505 |

*Primary Examiner*—Robert Kunemund
*Attorney, Agent, or Firm*—Coudert Brothers

[57] ABSTRACT

The present invention comprises growing gallium nitride films in the presence of bismuth using MBE at temperatures of about 1000 K or less. The present invention further comprises the gallium nitride films fabricated using the inventive fabrication method. The inventive films may be doped with magnesium or other dopants. The gallium nitride films were grown on sapphire substrates using a hollow anode Constricted Glow Discharge nitrogen plasma source. When bismuth was used as a surfactant, two-dimensional gallium nitride crystal sizes ranging between 10 $\mu$m and 20 $\mu$m were observed. This is 20 to 40 times larger than crystal sizes observed when GaN films were grown under similar circumstances but without bismuth. It is thought that the observed increase in crystal size is due bismuth inducing an increased surface diffusion coefficient for gallium. The calculated value of $4.7 \times 10^{-7}$ cm$^2$/sec. reveals a virtual substrate temperature of 1258 K which is 260 degrees higher than the actual one.

24 Claims, 1 Drawing Sheet

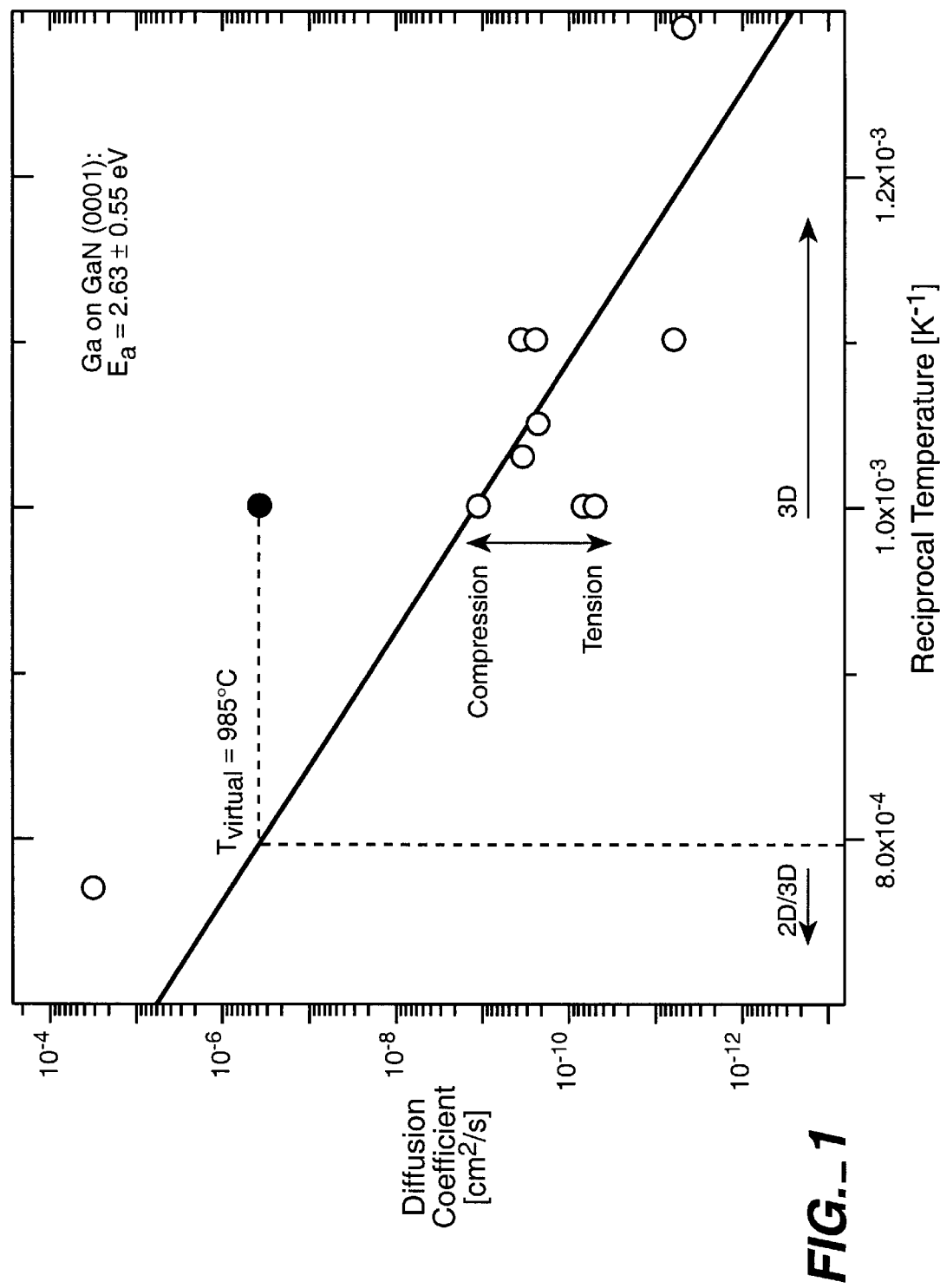
FIG._1

GROUP III-NITRIDE THIN FILMS GROWN USING MBE AND BISMUTH

This invention is disclosed in provisional application Ser. No. 60/043,042, filed, Apr. 3, 1997, incorporated herein by reference, and this application claims benefit of that provisional application.

This invention was made with U.S. Government support under Contract No. DE-AC03-76SF00098 between the U.S. Department of Energy and the University of California for the operation of Lawrence Berkeley National Laboratory. The U.S. Government may have certain rights in this invention.

I. BACKGROUND OF THE INVENTION

1. Field of the Invention

This invention relates generally to group III-nitride crystal growth and more specifically to gallium nitride crystal growth.

2. Description of Related Art

Because they can emit light from the ultraviolet to the visible spectral range, group-III nitrides (III-N) are the most promising materials for optoelectronic light sources (S. Nakamura, et al., Jpn. J. Appl. Phys. 34, L797 (1995); S. Nakamura, et al. Jpn. J. Appl. Phys 35, L217 (1996)). They also hold promise for high frequency power devices (M. A. Kahn, et al. Appl. Phys. Lett. 63, 1214 (1993). Usually, III-N films, for example GaN, are grown at temperatures that are below half the melting point temperature to prevent chemical decomposition during the growth process. In addition to semiconductor materials, III-N films also comprise ceramics which have many uses when deposited as thin films. This is described in, "A study of the physical properties and electrochemical behavior of AlN films" F. Vacandio, Y. Massiani, P. Gravier, Surface Coating and Technology 92, 1997, 221.

Two primary methods are currently used to grow III-N films such as, for example, GaN films: Metal Organic Chemical Vapor Deposition (MOCVD) and Molecular Beam Epitaxy (MBE). MOCVD is performed at high temperatures, about 1300 K, which leads to relatively high surface diffusion of ad-atoms. Each atom that is newly deposited on a substrate surface is referred to as an "ad-atom". Because there is a direct relationship between surface diffusion and formation of large crystal grains, MOCVD has in the past resulted in larger grain formation than MBE. Conventional MOCVD yields grain diameters in the range between about 40 $\mu$m to about 50 $\mu$m while conventional MBE yields grain diameters between about 0.5 $\mu$m and about 1 $\mu$m. Large grain size is desirable because it decreases the boundaries that charge carriers encounter, which in turn increases carrier mobility. A full discussion of the importance of carrier mobility and grain size can be found in "Semiconductor Devices, Physics and Technology" S. M. Sze, New York Wiley, 1985. Ideally the entire thin film grown would be of a single crystal. Instead, a number of crystals are formed which grow into one another to form the thin film. It is important to minimize the discontinuities at the boundaries between these crystal growing regions and this is done both by growing larger crystal regions so that there are fewer boundaries and by maintaining high degree of common crystal lattice orientation between the crystal regions. When the lattice orientation is maintained sufficiently, these crystal regions are referred to as 'grains' in the larger crystal thin film.

Although the MOCVD process results in large grain sizes, there are several drawbacks to the process. Suitable metal organic precursors must be available to create and dope the desired III-N thin film. The restriction in starting materials limits the types of end product that can be formed. In addition, the high temperatures at which MOCVD films are formed are close enough to thermal equilibrium to limit variation in the percent of various materials that make up the final film.

In contrast, the MBE growth process typically takes place at about 1000 K. Forming a film at temperatures that are farther away from thermal equilibrium of the III-N starting materials, allows higher concentrations of dopant to be incorporated into the final structure. In addition, the lower the film formation temperature is, the more possible it is to manipulate the concentration of component parts of the final film. Ad-atoms having less thermal energy are less likely to exclude a substitute atom from the forming lattice. Thus, forming a film at a lower temperature can help to increase doping levels or to grow high quality structures comprising added elements such as aluminum and/or indium. For example, using the relatively low crystal growth temperatures of MBE, compounds such as $Ga_xAl_{1-x}N$ and $Ga_yIn_{1-y}N$ can be formed, where x represents the relative percent Ga with respect to Al and y represents the relative percent Ga with respect to In. It can be seen that when x=0, the first compound becomes aluminum nitride (AlN), and when y=0, the second compound becomes indium nitride (InN). Alternatively, when x and y=1, the compounds become GaN. The drawback to MBE films grown at relatively low temperatures, for example about 30% to about 40% of a compound's melting point temperature (about 1000 K for GaN), is that the MBE films frequently exhibit a three-dimensional, instead of a two-dimensional, crystal growth and grain sizes that are limited by temperature and by strain. Films made using conventional MBE technology therefore have exhibited reduced carrier mobility. Excess strain originating from mismatched substrate and film lattice structures can be optimized by growth of suitable buffer layers on the substrate before a III-N film is grown. But it is not possible to increase the temperature at which MBE takes place because the differential vapor pressures of the nitrogen atoms alters the film composition under the vacuum in which MBE takes place.

It would be very desirable to have a method of growing large two-dimensional crystals of III-N compounds at low temperatures, utilizing flexible MBE technology.

II. SUMMARY OF THE INVENTION

It is an object of this invention to, at relatively low temperatures, grow III-N films having large two-dimensional crystals. It is a further object of the present invention to use Molecular Beam Epitaxy (MBE) to grow large two-dimensional films of III-N material.

The present invention comprises a two-dimensional crystalline film formed by molecular beam epitaxy comprising, a plurality of two-dimensional group III-nitride crystal grains having diameters between about 3 $\mu$m and about 40 $\mu$m, wherein each crystal lattice structure coalesces between the grains to form a continuous crystal; and a concentration of p-type carriers that exceeds that currently possible by metal organic chemical vapor deposition.

The present invention further comprises a crystaline, thin, group III-N film made by the method of, a) providing a molecular beam epitaxy instrument; b) cleaning a substrate and placing it in the instrument; c) heating the substrate; d) exposing the substrate to activated nitrogen; e) depositing a III-N buffer layer on the substrate; f) depositing bismuth on the substrate; and g) simultaneously depositing at least one group III element and nitrogen on the substrate.

III. SUMMARY DESCRIPTION OF THE DRAWINGS

FIG. 1: shows the surface diffusion coefficients as a function of the reciprocal temperature for a sample GaN film grown with Bi as a surfactant (solid circle) in comparison with GaN films grown without Bi as a surfactant (open circles).

IV. DETAILED DESCRIPTION OF THE INVENTION

The present invention comprises a two-dimensional crystalline film formed by molecular beam epitaxy comprising, a plurality of two-dimensional group III-nitride crystal grains having diameters between about 3 $\mu$m and about 40 $\mu$m, wherein each crystal lattice structure coalesces between the grains to form a continuous crystal; and a concentration of p-type carriers that exceeds that currently possible by metal organic chemical vapor deposition.

The present invention further comprises a crystaline, thin, group III-N film made by the method of, a) providing a molecular beam epitaxy instrument; b) cleaning a substrate and placing it in the instrument; c) heating the substrate; d) exposing the substrate to activated nitrogen; e) depositing a III-N buffer layer on the substrate; f) depositing bismuth on the substrate; and g) simultaneously depositing at least one group III element and nitrogen on the substrate.

When atoms are deposited on a substrate surface during Molecular Beam Epitaxy (MBE) they may stick on to the surface and not move along it. This type of deposition results in an amorphous structure. Alternatively, they may move, or diffuse, along the two dimensional surface of the substrate before stopping. If they diffuse until they encounter another atom or crystal structure they will bind into the crystal lattice and increase the two dimensional size of the oriented crystalline film. Thus, increasing diffusion lengths of newly deposited atoms increases the two-dimensional size of the crystals. It would be ideal, for purposes of creating optoelectronic films, if each deposited two dimensional film was a single crystal. In the case of a gallium nitride film (GaN), that would mean that each gallium would diffuse until it bound to a nitrogen in a suitable lattice site and each nitrogen would diffuse until it bound to a gallium in a suitable lattice site. Typically surface diffusion length is increased by increasing the temperature of the process.

Differential evaporation of nitrogen during high temperature MBE has been minimized by using large flux nitrogen sources. For example, a Constricted Glow Discharges (CGD) plasma source, available at the Lawrence Berkeley National Laboratory in Berkeley, California, was used to achieve a growth rate of 1.4 $\mu$m/hour for GaN. When several CGD sources are used, film decomposition under high temperature vacuum can be overcome even at growth temperatures greater than about 1073 K. However, the growth under high nitrogen flux is largely vertical and the two-dimensional growth that yields large grain diameter is not satisfactory. In contrast, the present invention increases two-dimensional crystal growth, and thus grain diameter, for films grown at about 1000 K.

The present invention comprises using bismuth (Bi) as a surfactant for growth of III-N films by MBE. It is speculated that the presence of bismuth on the substrate, increases the diffusion length of ad-atoms. Bi is an especially good choice because Bi is isoelectronic with N but has a much larger atomic size. The covalent radius of N is approximately 0.07 nm while the covalent radius of Bi is approximately 0.15 nm. This difference in radii makes it unlikely that large amounts of Bi becomes incorporated into the GaN film during film growth. At the same time, however, Bi that is located on the surface of the substrate interacts with Ga, causing it to diffuse further. Other elements in the V column of the periodic table could be used as surfactants, such as antimony (Sb) or arsenic (As). As the size of the atom used as a surfactant decreases, it is more likely to be substituted into the III-N lattice and affect the property of the film.

Because using Bi as a surfactant allows films having acceptable grain size for optoelectric effects to be grown at lower temperatures than previously possible, the composition of the film can also be altered. As the temperature of film growth decreases, the film components become less limited by solubility and the crystal lattice can accommodate stress and elastic strain more easily so that a large percent of dopant can be introduced. At the lower temperature, crystal atoms that are less energetically favored, can be substituted more easily for the more energetically favored ones. Furthermore, the solubility properties will permit a greater variety of proportional constituency from substitute group III elements. So, for example, some Al or In atoms may be substituted for a certain number of Ga atoms. The amount of substitution is determined by the properties desired in the resultant film. Typically it is desirable to substitute between about 10% and about 40% of Al atoms for Ga atoms; alternatively between about 5% and about 50% of In atoms are typically substituted for Ga atoms. In some circumstances between about 20% and about 40% of In atoms are substituted for Ga atoms. In theory, however, the substitution can range from 0 to 100%.

Also, doping occurs more easily when the growth temperature is further below the thermal equilibrium temperature. The Mg dopant is larger than Ga, so incorporation of Mg for Ga produces stress. When the growth, i.e. substrate, temperature is higher, the lattice is more energetic in excluding excess Mg atoms. It is also possible, when growing at lower temperatures, to introduce secondary dopant atoms such as beryllium (Be) which is smaller than both Ga and Mg. The Be then acts both as a p-type dopant and lowers the average stress on the lattice introduced by the Mg p-type dopant. Typically, about 10 times more dopant can be incorproated into a film grown by MBE than one grown by MOCVD.

The inventive material is made by coevaporating at least one group III element, and Bi in the presence of activated N onto a clean substrate. Activated nitrogen is molecular or atomic nitrogen, or nitrogen ions, in which some of the electrons are excited. Alternatively, Magnesium (Mg) dopant is also coevaporated onto the substrate. The concentration of Bi, Ga, and Mg is determined by controlling the temperature of the evaporation source, which in turn determines the partial pressure of the element in the MBE chamber. Thus it is common to cite the concentration of these components in terms of their source temperatures. A variety of Bi concentrations can be used, ranging from about 475 K to about 875 K. Better results were observed in the range of Bi concentrations resulting from a source temperature between about 525 K and about 775 K. The best results were obtained using concentrations between about 575 K and about 675 K.

The source temperature of Ga can vary between about 1000 K and about 1300 K. Similarly the source temperature of Mg can vary between about 400 K and about 700 K. More preferably, the Mg source temperature is between about 500 K and about 600 K.

Nitrogen flux is measured in standard cubic centimeters (sccm). The nitrogen flux is typically maintained between about 0.5 sccm and about 200 sccm. More preferably the nitrogen flux is between about 1 sccm and about 10 sccm.

EXAMPLE 1

Undoped GaN films grown in the presence of Bi.

Substrates were prepared for deposition of the inventive optoelectronic GaN film by cleaning steps that followed a standard cleaning process. The substrates were degreased by boiling in acetone and ethyl alcohol for 5 minutes each and blown dry with nitrogen. After degassing in the load lock for 30 min at 500° C., they were transferred into the growth chamber. The substrates were then heated up to 700° C. for thermal desorption of surface contaminants. At this temperature, they were exposed to activated nitrogen for 10 minutes. Subsequently, a thin, low-temperature GaN buffer layer (~250 Å) was deposited on the substrate. Its particular thickness was determined and optimized to minimize the strain (Kisielowski, C. et al., Phys. Rev BII 54, 17745, 1996); M. S. H. Leung et al. Mat. Res. Symp. Proc. 449, 1997, p 221 and H. Fujii et al. Mat. Res. Symp. Proc. 449, 1997, p.227); these three references incorporated herein by reference.

Finally, the main epitaxial layer was grown on the buffer layer for 4 hours. GaN layers were grown using a rebuilt Riber 1000 MBE system. Knudsen cells were used to evaporate pure Ga (99.9999%), and Bi (99.9999%). The activated nitrogen was produced by a hollow anode CGD plasma source using pure nitrogen gas (99.9999%) along with a Millipore nitrogen purifier. Details of the source design are given by A. Anders and S. Anders, *Plasma Sources Sci. Technol.* 4, 571, 1995. A dc voltage was used to generate a glow discharge that was constricted to an area in the plasma chamber close to the gas exit. The pressure difference between the plasma chamber and the MBE growth chamber extracted the activated nitrogen species having energies around 5 eV. A liquid nitrogen cryoshroud was used during growth to obtain a base pressure in the chamber of $\sim 2 \times 10^{-10}$ Torr. A thin titanium (Ti) layer on the back of the 10×11 mm² c-plane sapphire substrate absorbed the heat radiated from the tungsten (W) filament heater. The temperature of the substrate was monitored with a pyrometer.

Typical growth conditions were: Ga source temperature: 1210 K; nitrogen flow rate: 5–80 sccm; buffer-layer growth-temperature: 773 K; main-layer growth-temperature: 1000 K. The growth temperatures are controlled by heating the substrate to the desired temperature. The Bi source temperature was varied in the range of 523 K to 823 K. During the growth, the nitrogen partial-pressure in the chamber was in the range of between about $10^{-5}$ and about $10^{-2}$ Torr.

Atomic force microscopy (AFM) images were made of nominally undoped samples grown without Bi and of samples grown with different concentrations of Bi ($T_{Bi}$=623 K to 823 K). The images depicted areas that were 2×2 $\mu m^2$. The sample grown without any Bismuth exhibited small crystals with irregular boundaries. Experiments have shown that these crystals can be disconnected (M. S. H. Leung, et al. *Proceedings of Materials Research Society* (MRS) 1996 Fall Meeting), and this was confirmed in a drastically reduced carrier mobility of 6 cm²/Vs. The presence of a small amount of Bi, i.e. from source temperatures between 475 K and 625 K results in the crystals coalescing at their boundaries. Concomitantly, Hall mobility of n-type carriers increases to 73 cm²/Vs. The background n-type carrier concentration was unchanged and exceeded $10^{18}$ cm⁻³. This rather high n-type concentration was probably caused by oxygen contamination of the growth chamber which was opened before these runs. A further increase of the Bi temperature to 723 K and 823 K yields continued enlargement of the two-dimensional crystal size. However, at these higher Bi concentrations there was poorer coalescence at the crystal boundaries and the Hall mobility decreased, as shown in Table I.

TABLE 1

Carrier mobility as a function of the Bismuth temperature in GaN films grown with and without Bismuth surfactant

| $T_{Bi}$ (K) | — | 623 | 723 | 823 |
|---|---|---|---|---|
| $\mu$(cm²/Vs) | 6 | 73 | 10 | 3 |

EXAMPLE 2

Mg-doped GaN films grown in the presence of Bi.

Films were prepared as described above, using, in addition, Knudsen cells to evaporate Mg (99.99% pure).

Magnesium (Mg) doped GaN thin films grown in the presence of Bi ($T_{Bi}$=350° C. and $T_{Mg}$=280° C.) exhibited crystal sizes that compared well with those of the unintentionally doped n-type films described above. Unexpectedly, the size of the surface features, which corresponded to two-dimensional crystal size, increased significantly to about 10 $\mu$m in diameter when Bi surfactant was used from a 623 K source. When the temperature was increased, The background impurity concentration was kept low and the intrinsic n-doping did not exceed $10^{17}$ cm³.

Previous experiments (Fujii et al., Ibid. 1997) suggested that the feature sizes that can be observed on the films relate to the size of oriented crystals which form the GaN thin films. This crystal size limitation was attributed to a temperature and strain dependence of the Ga surface diffusion coefficient (H. Fujii et al. Mat. Res. Soc Symp., Vol 449, 1997). The Bi surfactant thus appears to alter the Ga surface diffusion coefficient on the GaN (0001) faces, too. If we assume that surface diffusion only occurs during the growth of a double layer of Ga and N (thickness 0.26 nm), a surface diffusion length $(D \tau_0)^{1/2}$ can be estimated where D is the surface diffusion coefficient and $\tau_0$ is the time that is required to grow the double layer. Since both the growth rate and the crystal size can be extracted from the experiments we can estimate Ga surface diffusion coefficients. They are shown as a function of reciprocal temperature in FIG. 1. Values for samples grown without surfactant are shown by open circles and are taken from Fujii reference above; they depict the temperature and stress dependence of the surface diffusion coefficient. Values for samples grown with surfactant are shown by solid circles. It is seen that the utilization of Bi as a surfactant leads to a increase of the diffusion coefficient. A surface diffusion coefficient was calculated as described above that, with out the presence of Bi would have been expected for a growth temperature of 1258 K. In the presence of Bi that diffusion coefficient of $10^{-6}$ cm²/sec, was observed for a sample is grown at only 1000 K. Thus, the use of a bismuth surfactant is beneficial in several respects. Use of Bi as a surfactants promotes increased crystal size in III-N thin films grown at a given temperature. Additionally, when used in the correct concentrations, concentration, the Bi surfactant promotes coalescence of crystal boundaries.

Because using Bi as a surfactant allows films having acceptable grain size for optoelectric effects to be grown at lower temperatures than previously possible, the composition of the films can also be altered. At the lower temperature, less energetically favored crystal atoms can be substituted more easily for the more energetically favored ones. Furthermore, the solubility properties will permit a greater variety of proportional constituency from substitute group III elements. So, for example, some Al or In atoms may be substituted for a certain number of Ga atoms. There are thin crystaline films having, for example, x equal to about 15 ($Ga_{85}Al_{15}N$), or y equal to about 50 ($Ga_{50}In_{50}N$) that cannot be made using MOCVD and which have particularly interesting properties. These inventive films can be made by MBE using Bismuth as a surfactant during film growth.

Also, doping occurs more easily when the growth temperature is further below the thermal equilibrium temperature. The Mg dopant is larger than Ga, so incorporation of Mg for Ga produces stress. When the growth, i.e. substrate, temperature is higher, the lattice is more energetic in excluding excess Mg atoms. It is also possible, when growing at lower temperatures, to introduce secondary dopant atoms such as beryllium (Be) which is smaller than both Ga and Mg. The Be then acts both as a p-type dopant and lowers the average stress on the lattice introduced by the Mg p-type dopant.

EXAMPLE 3

Lateral Overgrowth of III-N films

Lateral overgrowth is a technique currently used in MOCVD-grown films to obtain regular grain sizes and shapes having low defect densities like dislocations or grain boundaries. For lateral overgrowth to work, the lateral growth rate of the film must exceed the vertical growth rate.

A substrate such as a silicon, sapphire, silicon carbide, germanium, gallium nitride, gallium arsenide, or other wafer is coated with, for example, an oxide layer, or a photoresist layer having about a thickness on the order of nanometers (nm). Grooves are etched in the layer. The groove dimensions are about 1 $\mu$m wide and the spacing between the grooves is about twice the radius of the typical grain radius on an ungrooved surface.

The III-N film is first grown to fill the grooves, then continued growth takes place, overgrowing the grooves until the films growing out of each groove meet and coalesce in the middle of the space between the grooves and a continuous thin film is formed.

Previously it was not possible to perform lateral overgrowth techniques using MBE-grown films because the grain sizes were too small to properly overgrow the space between the grooves. MBE-grown films of the present invention however form laterally overgrown crystal layers, that incorporate the benefits of being grown farther away from thermal equilibrium than the MOCVD films are. The inventive laterally overgrown films incorporate more dopant and are not limited to high temperature solubilities of the component atoms.

EXAMPLE 4

Quasi-ternary systems including ceramic coatings.

Group III nitrides include a number of important compounds in addition to semiconductors. For example, MBE ceramic films can be grown using Bi as a surfactant at temperatures that are low relative to the melting point of the compound. At these low temperatures, the composition is not limited to melting point solubility factors and the ceramic films can be designed to have many different compositions. The manufacture parameters of ceramic films by MBE is know to practicioners skilled in the art and is not the subject of this invention. The addition of bismuth during the MBE growth of the ceramic films is new to the present inventive method and results in novel ceramic formulations as well as larger grains than conventionally achieved at a given temperature without use of Bi.

High concentrations of Al, even 100% Al (that is, x=0) form hard ceramics, having high melting points. AlN is particularly important because of its high thermal conductivity. Thin coatings of AlN are beneficial for a variant of engine parts and computer parts.

Thus, the invention provides III-N semiconducting and ceramic films that are not limited in their composition to melting point solubility factors, can accept high concentrations of dopants, and form acceptably large grain sizes for optoelectronic components. GaN thin films that exhibit up to 40 $\mu$m diameter grains sizes were grown at 1000 K. The grain sizes were actively determined by engineering the strain in the layers and by using surfactants. The result suggests that the surface diffusion coefficient can be varied by more than 4 orders of magnitude at a growth temperature as low as 1000 K. In addition, surfactants cause the crystals in GaN thin films to coalescence. This influences the lateral Hall mobility of the films.

The description of illustrative embodiments and best modes of the present invention is not intended to limit the scope of the invention. Various modifications, alternative constructions and equivalents may be employed without departing from the true spirit and scope of the appended claims.

We claim:

1. A crystaline, thin, group III-N film made by the method of,
   a) providing a molecular beam epitaxy instrument;
   b) cleaning a substrate and placing it in the instrument;
   c) heating the substrate;
   d) exposing the substrate to activated nitrogen;
   e) depositing a III-N buffer layer on the substrate;
   f) depositing bismuth on the substrate; and
   g) simultaneously depositing at least one group III element and nitrogen on the substrate.

2. The product of claim 1 wherein the at least one group III element is chosen from the group consisting of gallium, aluminum, and indium, and boron.

3. The product of claim 2 wherein more than one group III element is deposited simultaneously with nitrogen on the substrate.

4. The product of claim 1 wherein the partial pressure of bismuth is equivalent to that produced by a 623 K source.

5. The product of claim 1 wherein the bismuth is deposited from a source having a temperature between about 475 K and about 875 K.

6. The product of claim 1 wherein the bismuth is deposited from a source having a temperature between about 525 K and about 775 K.

7. The product of claim 1 wherein the bismuth is deposited from a source having a temperature between about 575 K and about 675 K.

8. A method for making GaN films using molecular beam epitaxy comprising,
   a) cleaning a substrate;
   b) heating a substrate;
   c) exposing the substrate to activated nitrogen;
   d) depositing a group III-nitrogen buffer layer on the substrate;
   e) depositing bismuth on the substrate; and
   f) simultaneously depositing at least one group III element, and nitrogen on the substrate.

9. The method of claim 8 further comprising depositing a p-type dopant on the substrate simultaneously with depositing the at least one group III element and nitrogen.

10. The method of claim 8 wherein the bismuth is deposited from a source having a temperature between about 475 K and about 875 K.

11. The method of claim 10 wherein the bismuth is deposited from a source having a temperature between about 525 K and about 775 K.

12. The method of claim 11 wherein the bismuth is deposited from a source having a temperature between about 575 K and about 675 K.

13. The method of claim 8 wherein the bismuth is deposited from a source having a temperature between about 800 K and about 1500 K.

14. The method of claim 13 wherein the gallium is deposited from a source having a temperature between about 1000 K and about 1300 K.

15. The method of claim 8 wherein the magnesium is deposited from a source having a temperature between about 400 K and about 700 K.

16. The method of claim 15 wherein the magnesium is deposited from a source having a temperature between about 500 K and about 600 K.

17. The method of claim 8 wherein the nitrogen is deposited using a flux rate between about 0.5 sccm and about 200 sccm.

18. The method of claim 17 wherein the nitrogen is deposited using a flux rate between about 1 sccm and about 10 sccm.

19. The method of claim 8 wherein the substrate temperature is between about 800 K and about 1100 K during crystal growth.

20. The method of claim 19 wherein the substrate temperature is between about 900 K and about 1000 K during crystal growth.

21. The method of claim 8 wherein the at least one group III element is chosen from the group consisting of gallium, aluminum, and indium, and boron.

22. The method of claim 8 wherein more than one group III element is deposited simultaneously with nitrogen on the substrate.

23. The method of claim 22 wherein two group III elements, gallium and aluminum, are deposited on the substrate.

24. The method of claim 22 wherein two group III elements, gallium and indium, are deposited on the substrate.

* * * * *